US012478050B2

(12) United States Patent
Ding et al.

(10) Patent No.: US 12,478,050 B2
(45) Date of Patent: Nov. 25, 2025

(54) GYM ON A CHIP FOR SMALL ANIMAL EXERCISE

(71) Applicant: The Regents of the University of Colorado, a body, Denver, CO (US)

(72) Inventors: Xiaoyun Ding, Superior, CO (US); Nakul Sridhar, Beaverton, OR (US); Ding Xue, Boulder, CO (US); Joyita Bhadra, Boulder, CO (US)

(73) Assignee: The Regents of the University of Colorado, a body corporate, Denver, CO (US)

( * ) Notice: Subject to any disclaimer, the term of this patent is extended or adjusted under 35 U.S.C. 154(b) by 335 days.

(21) Appl. No.: 17/807,849

(22) Filed: Jun. 20, 2022

(65) Prior Publication Data

US 2022/0400658 A1 Dec. 22, 2022

Related U.S. Application Data

(60) Provisional application No. 63/212,317, filed on Jun. 18, 2021.

(51) Int. Cl.
*A01K 67/30* (2025.01)
*A01K 29/00* (2006.01)
(Continued)

(52) U.S. Cl.
CPC ............ *A01K 67/30* (2025.01); *A01K 29/005* (2013.01); *A61D 99/00* (2013.01); *H03H 9/0009* (2013.01);
(Continued)

(58) Field of Classification Search
CPC ............... A61H 1/005; A61H 23/0245; A61H 2203/03; H03H 9/0009; H03H 2009/0019;
(Continued)

(56) References Cited

U.S. PATENT DOCUMENTS

2007/0282172 A1\* 12/2007 Toumazou ............. A61B 5/031
600/300
2022/0116011 A1\* 4/2022 Lee .................... H03H 9/02535

OTHER PUBLICATIONS

Teo et al., "A novel vibration-induced exercise paradigm improves fitness and lipid metabolism of Caenorhabditis elegans", Jun. 20, 2018, Scientific Reports, pp. 1-15 (Year: 2018).\*

(Continued)

*Primary Examiner* — Jonathan M Dunlap
(74) *Attorney, Agent, or Firm* — McGaw Law, P.C.; Michael M. McGaw

(57) ABSTRACT

A new on chip system, named Acoustic Gym, to apply a surface acoustic wave (SAW) has been developed to control the swimming exercise of a large number of small animals such as *C. elegans* and Zebra fish, at desired intensities and durations. The SAW device consists of a circular chamber filled with fluid, which is placed in the center between a pair of offset interdigital transducers (IDTs) that are deposited on a piezoelectric substrate. Upon actuation from a radio frequency (RF) source, the SAW is generated and propagates along the substrate towards the microchamber. Once the SAW reaches the chamber, it induces an acoustic streaming in the fluid inside the chamber to stimulate swimming exercise of small animals. The streaming velocity can be precisely controlled via the RF signal input power, thus regulating the duration and intensity of exercise of the animals.

8 Claims, 9 Drawing Sheets

(51) Int. Cl.
- *A61D 99/00* (2006.01)
- *A61H 1/00* (2006.01)
- *A61H 23/02* (2006.01)
- *H03H 9/00* (2006.01)
- *H03H 9/02* (2006.01)

(52) U.S. Cl.
CPC ......... *H03H 9/02535* (2013.01); *A61H 1/005* (2013.01); *A61H 23/0245* (2013.01); *A61H 2203/03* (2013.01); *H03H 2009/0019* (2013.01)

(58) Field of Classification Search
CPC .............. H03H 9/02535; A01K 67/033; A01K 29/005; A61D 99/00
USPC ................. 73/570; 310/313 R, 313 D, 313 B
See application file for complete search history.

(56) References Cited

OTHER PUBLICATIONS

Miansari et al., "Inducing Mild Traumatic Brain Injury in C. elegans via Cavitation-Free Surface Acoustic Wave-Driven Ultrasonic Irradiation", Sep. 4, 2019, Scientific Reports, pp. 1-11 (Year: 2019).*

Peng et. al., Mechanisms and Applications of Neuromodulation Using Surface Acoustic Waves—A Mini-Review, Jan. 2021, Frontiers in Neuroscience, vol. 15, Article 629056 (Year: 2021).*

Zheng et al., "Focusing surface acoustic waves assisted electrochemical detector in microfluidics", Electrophoresis, vol. 41, Iss 10-11: Mcirfluids, Nanofluids and Lab on a Chip in Asia 2019, pubblished Oct. 25, 2019, <https://analyticalsciencejournals.onlinelibrary.wiley.com/doi/10.1002/elps.201900315> (Year: 2019).*

Hsu et al., "Driving Rotational Circulation in a Microfluidic Chamber Using Dual Focused Surface-Acoustic-Wave Beams", Micromachines 2025, 16(2), 140, <https://www.mdpi.com/2072-666X/16/2/140> (Year: 2025).*

Shilton et al., "Rotational microfluidic motor for on-chip microcentrifugation", Applied Physics Letters, vol. 28, Iss. 25, Jun. 20, 2011, <https://pubs.aip.org/aip/apl/article/98/25/254103/340532/Rotational-microfluidic-motor-for-on-chip> (Year: 2011).*

Yamaguchi et al., "Removable and replaceable micro-mixing system with surface acoustic wave actuators", Japanese Journal of Applied Physics, vol. 63, No. 3, Mar. 6, 2024, <https://iopscience.iop.org/article/10.35848/1347-4065/ad2aa4> (Year: 2024).*

Chokshi, Trushal Vijaykumar, Adela Ben-Yakar, and Nikos Chronis. "$CO_2$ and compressive immobilization of C. elegans on-chip." Lab on a Chip 9.1 (2009): 151-157.

Hulme, S. Elizabeth, et al. "A microfabricated array of clamps for immobilizing and imaging C. elegans." Lab on a Chip 7.11 (2007): 1515-1523.

Gilleland, Cody L., et al. "Microfluidic immobilization of physiologically active Caenorhabditis elegans." Nature protocols 5.12 (2010): 1888-1902.

Crane, Matthew M., et al. "Autonomous screening of C. elegans identifies genes implicated in synaptogenesis." Nature methods 9.10 (2012): 977-980.

Wang, Xixian, et al. "Highly efficient microfluidic sorting device for synchronizing developmental stages of C. elegans based on deflecting electrotaxis." Lab on a Chip 15.11 (2015): 2513-2521.

Banse SA, Blue BW, Robinson KJ, Jarrett CM, Phillips PC (2019) The Stress-Chip: A microfluidic platform for stress analysis in Caenorhabditis elegans. PLOS ONE 14(5): e0216283.

Cho, Y., Lee, S. A., Chew, Y. L., Broderick, K., Schafer, W. R., Lu, H., Multimodal Stimulation in a Microfluidic Device Facilitates Studies of Interneurons in Sensory Integration in C. elegans. Small 2020, 16, 1905852.

Ding, Xiaoyun, et al. "Surface acoustic wave microfluidics." Lab on a Chip 13.18 (2013): 3626-3649.

Ding, Xiaoyun, et al. "On-chip manipulation of single microparticles, cells, and organisms using surface acoustic waves." Proceedings of the National Academy of Sciences 109.28 (2012): 11105-11109.

Zhang, Jinxin, et al. "Surface acoustic waves enable rotational manipulation of Caenorhabditis elegans." Lab on a Chip 19.6 (2019): 984-992.

* cited by examiner

GYM ON A CHIP FOR SMALL ANIMAL EXERCISE

CROSS-REFERENCE TO RELATED APPLICATIONS

This application claims the benefit of U.S. Provisional Application No. 63/212,317 filed Jun. 18, 2021.

BACKGROUND OF THE INVENTION

Parkinson's disease is a progressive nervous system disorder of dopaminergic neurons in the substantia nigra region of the brain [Lees, A. J. et al. *Lancet* 373, 2055-66 (2009)]. It is the second most prevalent neurodegenerative disease worldwide, and particularly affects the growing elderly population. PD has no cure, and all current treatments only target motor functions through drug treatment or surgery. Previous studies have shown that regular exercise prevents dopaminergic neuronal loss in PD patients and some toxin-induced PD models of rats [Goodwin, V. A. et al. *Movement Disorders* 23(5), 631-640, (2008); Yoon, M. C. et al. *Neurosci Lett.* 423, 12-17 (2007); Oliveira, L. O. D. et al. *Met Brain Disease* 35(1), 175-181 (2020)]. However, in older populations, the ability and willingness to regularly exercise decrease due to poor health and physical weakness. Therefore, it is important to identify therapeutic means that can bypass the exercise regimen altogether, but still bestow all the benefits. Blood plasma from mice that had exercised have been shown to increase neurogenesis in aged recipient mice [Horowitz, A. M. et al. *Science* 369, 167-173 (2020)]. However, it is still challenging to identify specific exercise-related factors responsible for alleviating neuronal loss in the aged brain.

Studies have shown that *Caenorhabditis elegans*, a PD model, can gain beneficial effects from swimming. However, most of the methods are labor-intensive and time consuming. Also, for passive swimming setups, it is difficult to the control intensity of exercise. What is needed is a system that can overcome these limitations. The present invention meets this important need as will become apparent in the following disclosure.

SUMMARY OF THE INVENTION

A surface acoustic wave (SAW) is an acoustic wave, that travels along the surface of an elastic material. A SAW has been integrated in microfluidic devices to impart acoustic forces in a controlled manner to precisely regulate the movement of worms, such as *C. elegans*.

A new on chip system, which has been named "Acoustic Gym," to apply a SAW (surface acoustic wave) has been developed to control the swimming exercise of small animals, such as *C. elegans*, Zebra fish, etc., at desired intensities and durations. The SAW device consists of a circular chamber filled with fluid, which is placed in the center between a pair of offset interdigital transducers (IDTs) that are deposited on a piezoelectric substrate. Upon actuation from a radio frequency (RF) source, the surface acoustic wave is generated and propagates along the substrate towards the microchamber. Once the SAW reaches the chamber, it induces an acoustic streaming in the fluid inside the chamber to stimulate swimming exercise of small animals. The streaming velocity can be precisely controlled via the RF signal input power, thus regulating the duration and intensity of exercise of the animals.

The present invention uses acoustic streaming to regulate the fluid within a microchamber, thus regulating the swimming exercise of small animals on a chip in both duration and intensity. This capability has not been shown before. This technology can also be integrated to current standard well plates. Application includes use in research labs that study exercise/muscle related diseases or to study a small animal model, such as *C. elegans* and Zebra fish. This high throughput technique can be used for drug screening for muscle related disease such as Parkinson's disease. The techniques and devices of the invention can be used as a tool to study *C. elegans*, Zebrafish and other small animals or as a high throughput method for drug screening.

A SAW system has been used to build an "Acoustic Gym" to control the swimming intensity of a large number of worms. As a model for Parkinson's disease (PD), we have selected baIn11 worms, that overexpress human α-synuclein, leading to dopaminergic (DA) neuron loss.

BRIEF DESCRIPTION OF THE DRAWINGS

For a fuller understanding of the invention, reference should be made to the following detailed description, taken in connection with the accompanying drawings, in which.

DETAILED DESCRIPTION OF THE PREFERRED EMBODIMENT

Figure 1A:
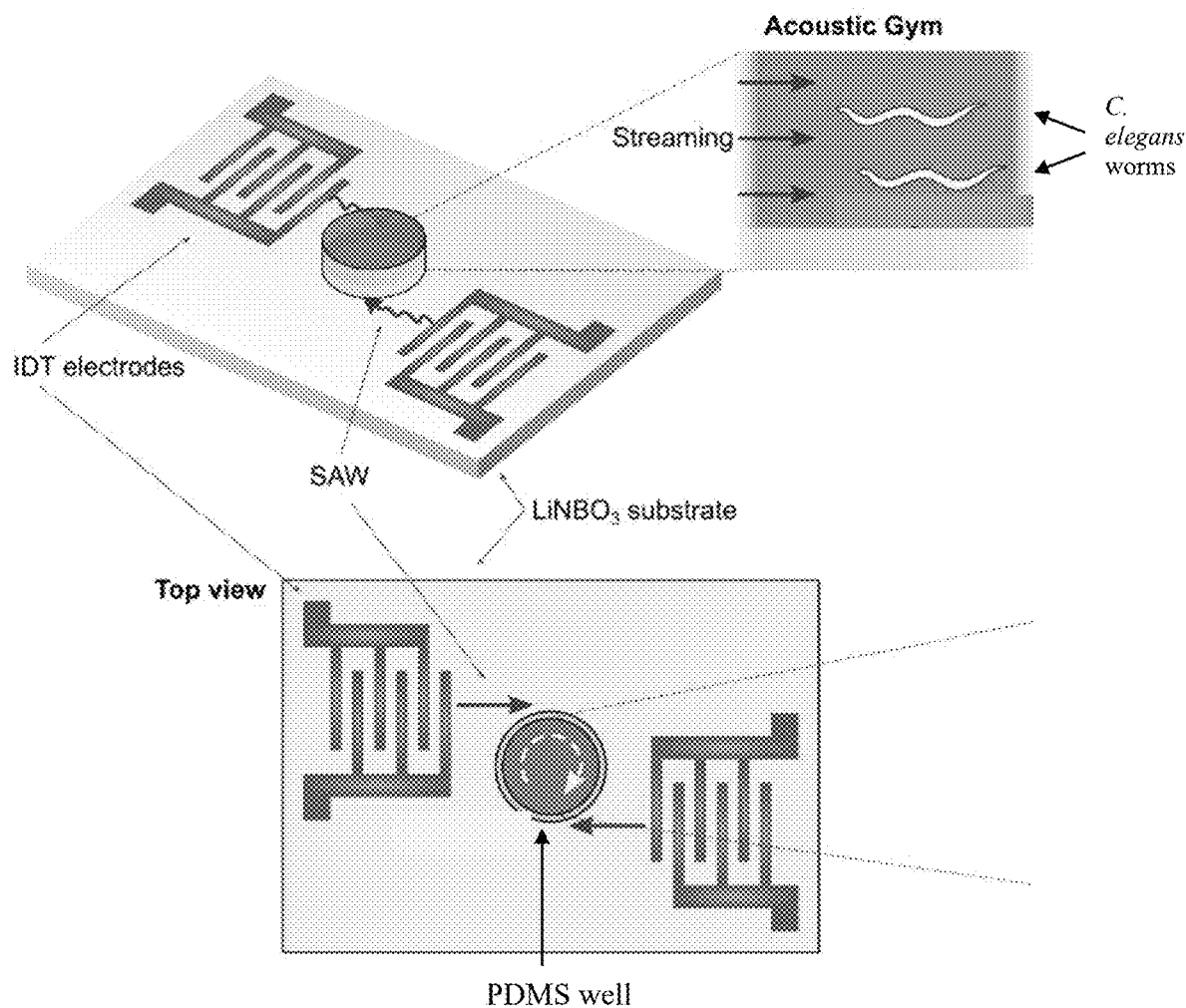
FIG. 1 is a set of three illustrations (A-C) and a pair of graphs (D-E) showing the characterization of a microfluidic device that applies a SAW with controlled intensity and duration. (A) Schematic and (B) photo of SAW device illustrating offset IDTs that produce clockwise streaming in PDMS chamber. Scale bar: 6 mm. (C) Top view velocity colormap produced by tracking microparticles (n=5264) dispersed in fluid under 0.125 W, 50% duty cycle showing an even distribution of streaming throughout the chamber area. (D) Graph showing the mean instantaneous particle velocity for different RF input powers and duty cycles (n=9), allowing for precise controllability of streaming in the device. (E) Graph showing the thermal characterization for different RF input powers and duty cycles (15 minutes in each). Nine independent experiments were performed for each condition in (d) and three independent measurements were done for (E). *P<0.05, P<0.01, *P<0.001, two-sided, unpaired t-test.

Parkinson's disease (PD) is the second most prevalent neuronal disorder that affects older populations at a higher rate. PD is characterized by a loss of dopaminergic (DA) neurons in the substantia nigra part of the brain. Currently there is no cure for PD. Regular long-term exercise has been proposed to be an attractive option in alleviating PD symptoms. However, the will and ability to exercise decreases significantly in the older population due to poor health and physical weakness. It is still challenging to identify beneficial exercise-related factors as a possible way of reducing neuronal loss in the aged brain. A microfluidic device integrated with Surface Acoustic Wave (SAW) technology has been created as a potential treatment to reduce DA neuronal loss in a Caenorhabditis elegans PD model. Loss of DA neurons can be partially suppressed in worms overexpressing human α-synuclein by SAW-induced swimming exercise in a controllable manner. This platform can help identify potential drug targets of PD and compounds that can enhance the beneficial effects of exercise by treating the animal model under conditions made possible by the device taught herein.

A microfluidic device integrated with Surface Acoustic Wave (SAW) technology has been created as a potential treatment to reduce dopaminergic (DA) neuron loss in a Caenorhabditis elegans Parkinson's disease model. SAW-induced swimming exercise in a controllable manner can partially rescue loss of DA neurons in worms overexpressing human alpha-synuclein (α-syn). This platform will facilitate identification of factors and drugs that help alleviate PD through exercise.

Parkinson's disease is a progressive nervous system disorder of dopaminergic neurons in the substantia nigra region of the brain [Lees, A. J. et al. Lancet 373, 2055-66 (2009)]. It is the second most prevalent neurodegenerative disease worldwide, and particularly affects the growing elderly population. PD has no cure, and all current treatments only target motor functions through drug treatment or surgery. Previous studies have shown that regular exercise prevents dopaminergic neuronal loss in PD patients and some toxin-induced PD models of rats [Goodwin, V. A. et al. Movement Disorders 23(5), 631-640, (2008); Yoon, M. C. et al. Neurosci Lett. 423, 12-17 (2007); Oliveira, L. O. D. et al. Met Brain Disease 35(1), 175-181 (2020)]. However, in the older population, the ability and willingness to regularly exercise decrease due to poor health and physical weakness. Therefore, it is important to identify therapeutic means that can bypass the exercise regimen altogether but still bestow all the benefits. Blood plasma from mice that had exercised have been shown to increase neurogenesis in aged recipient mice [Horowitz, A. M. et al. Science 369, 167-173 (2020)]. However, it is still challenging to identify specific exercise-related factors responsible for alleviating neuronal loss in the aged brain.

Caenorhabditis elegans (C. elegans), an animal model amenable to genetic and reverse genetic analyses, can aid in identifying these factors. It has been reported that C. elegans can gain beneficial effects of exercise through swimming in liquid [Laranjeiro, R. et al. Proc Natl Acad Sci USA 116, 23829-23839 (2019); Hartman, J. H. et al. Scientific reports 8, 8359 (2018)]. However, current methods to stimulate exercise in C. elegans rely on long-term passive swimming (several hours per day), which are relatively labor-intensive and time-consuming [Laranjeiro, R. et al. Proc Natl Acad Sci USA 116, 23829-23839 (2019)]. Moreover, passive swim exercise protocol was not able to control the exercise intensity. Therefore, generating consistent and uniform swimming exercise for each animal with controllable intensity and duration presents a significant challenge for current technology and is crucial for minimizing data variability for meaningful analysis.

Lab-on-a-chip microfluidic devices can provide an environment to confine and screen large numbers of worms in a controlled manner. Microfluidic devices can be used to immobilize worms, sort and screen worms, and study behavioral responses to controlled stimuli due to the advantages in precise micro-control, high throughput, and versatile functionality. Surface acoustic wave (SAW) technology has been integrated into microfluidic platforms as a method to apply acoustic forces in a controlled manner while maintaining high throughput capability. SAW microfluidics offer many potential benefits, including the ability to precisely control fluid actuation, while achieving high biocompatibility. Here, a new system has been designed and characterized to apply SAW to control the swimming exercise of a large number of worms at desired intensities and durations.

Figure 1B:
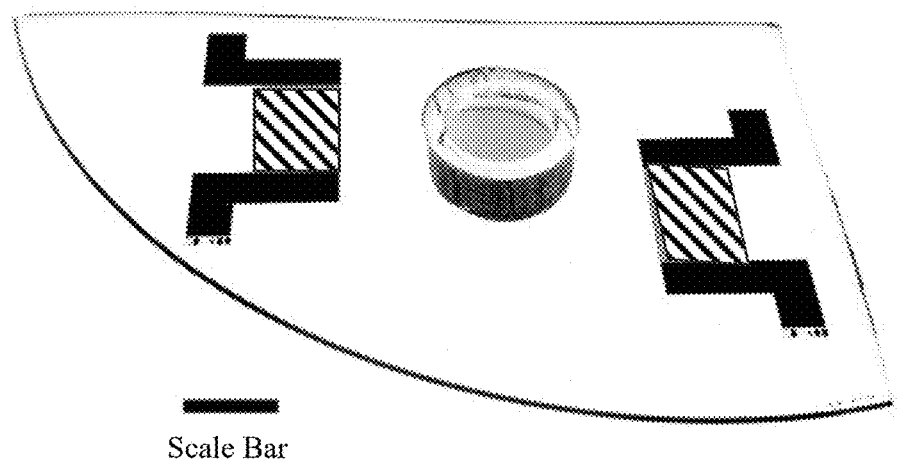

The design and working mechanism of a device according to aspects of the invention are shown in FIGS. 1A and 1B. The SAW device consists of a circular polydimethylsiloxane (PDMS) chamber filled with fluid, which is placed in the center between a pair of offset interdigital transducers (IDTs) that are deposited on a lithium niobate (LiNbO3) substrate (FIG. 1B). Upon actuation (18 MHz) from a radio frequency (RF) source, the SAW is generated and propagates along the substrate towards the PDMS chamber (FIGS. 1A and 1B). Once the SAW reaches the chamber, the difference in velocity of acoustic propagation along the fluid versus the substrate causes leakage of some of the wave energy into the fluid. This induces a clockwise rotational acoustic streaming in the fluid inside the chamber (FIG. 1A). The streaming velocity can be precisely controlled via the RF signal input power.

Figure 1C:
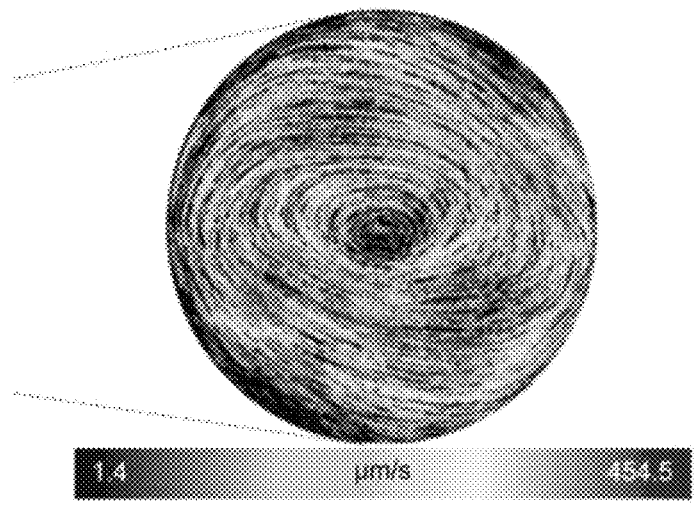
Figure 1D:
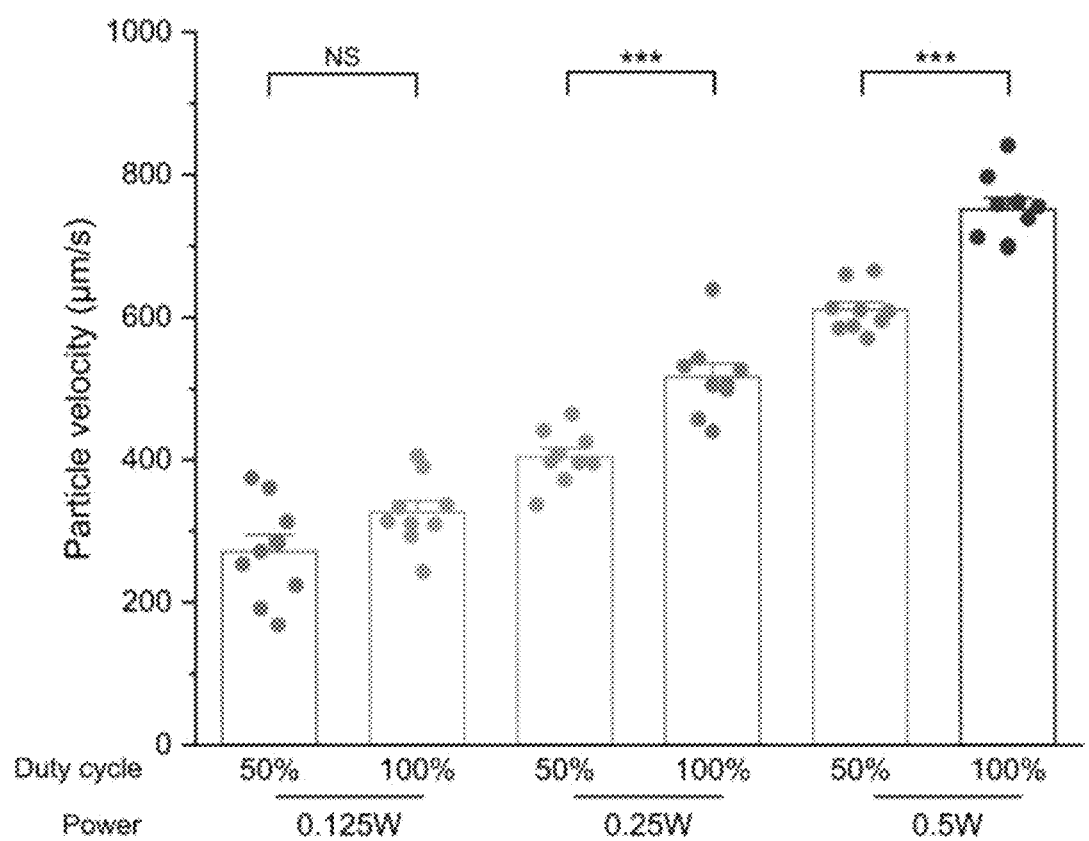
Figure 1E:
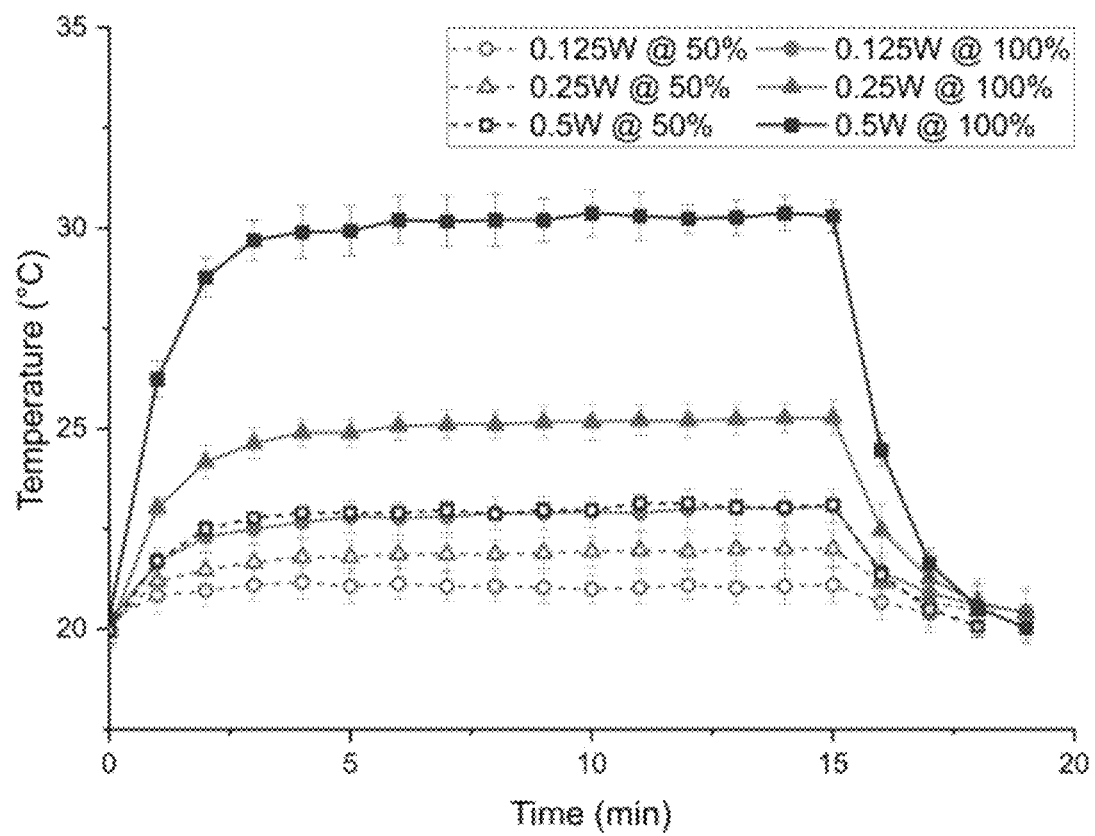

To test the controllability and to quantify the velocity distribution across the area of the SAW chamber, 15 μm polystyrene microparticles were dispersed in the fluid to track the streaming velocity for various applied SAW power levels at both 50% and continuous RF input duty cycles. After acquiring videos of the streaming at different power levels, the paths of individual particles were analyzed to generate a velocity colormap (FIG. 1A). The velocity of each individual particle track was then averaged together to calculate the overall mean velocity for each power level (FIG. 1D). Reducing the duty cycle from 100% to 50% at the same power level did slightly decrease the streaming velocity, only by 17-22% (FIG. 1D), but significantly decreased heating effects by 64-71%, as shown in (FIG. 1E). The velocity tracking shows that the streaming velocity is stable across most of the chamber area, with the exception of a small region in the center and the edges near the outer wall (FIG. 1C). These results indicate that C. elegans animals in the chamber would receive a similar amount of exposure to the SAW energy in the time average, irrespective of their initial location in the chamber. C. elegans are sensitive to small increases in temperature [Mori, I. Annual Review of Genetics 33, 399-422 (1999)] and exhibit altered activity, behavior and life span in environments with elevated temperatures [Muñoz, M. J. Mechanisms of Ageing and Devel-

*opment* 124, 43-48 (2003)]. Therefore, it is important to keep the heating effect minimal for accurate analysis. Since acoustic waves propagating in a fluid medium disperse energy into the fluid as heat [Das, P. Kr. et al. *Physics of Fluids* 31, 106106 (2019)], the acoustic heating effects were quantified by applying SAW for 15 minutes at different power levels with two different duty cycles and tracking the temperature increase over time, as well as their cool-down after the SAW was turned off. The results show that power levels higher than 0.125 W and 50% duty cycle caused a quantifiable increase in temperature (FIG. 1E). Therefore, the 0.125 W, 50% duty cycle power level is the best representation of the acoustic effect applied on the worms if a high power and duty cycle is desired with reduced heating.

Figure 2A:
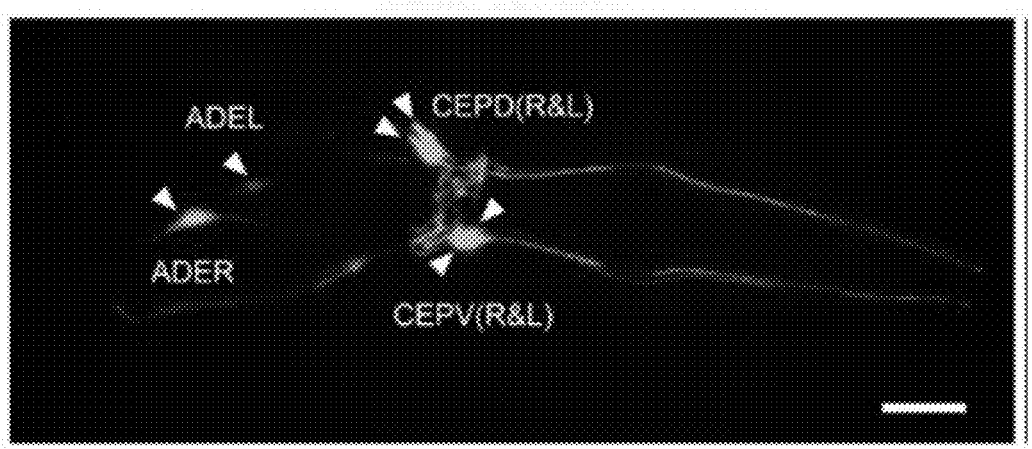
FIG. 2 is a set of three images (A-C) and three graphs (D-F) showing the characterization of dopaminergic neuronal loss following SAW treatment. (A) Visual representation of the six head dopaminergic neurons in vtIs1 (dat-1p::GFP+rol-6(su1006) Adult day 2 animals. (B) and (C), Visual representation of baIn11(dat-1_p_:_:_α-syn+dat-1p::GFP) animals, with representative images of adult day 2 animals that had no SAW treatment (B) and SAW treatment for 5 minutes at 0.125 W, 50% duty cycle (C). DA neurons are indicated with arrowheads. The ADEL neuron was lost in (B) and no DA neuron loss was observed in (C). Scale bars: 20 μm. (D) Comparison of DA neuron loss in baIn11 adult animals without or with SAW treatment for 5 minutes in M9 buffer at different intensity. Animals that were not transferred to the SAW device and kept on NGM plates were also scored and results are presented as "plate". (E) and (F), Comparison of DA neuron loss in baIn11 adult animals when SAW was applied at 0.125 W, 50% duty cycle with different durations using the gel media (E) and the M9 buffer media (F). Data are mean±s.e.m. At least nine independent experiments were performed for each condition. For each independent experiment, at least 30 animals were scored. *P<0.05, P<0.01, *P<0.001, two-sided, unpaired t-test.
Figure 2B:
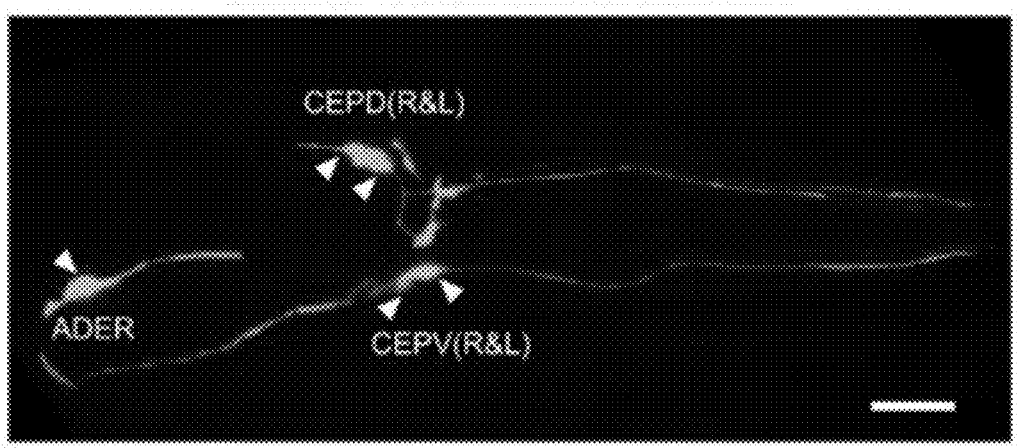
Figure 2C:
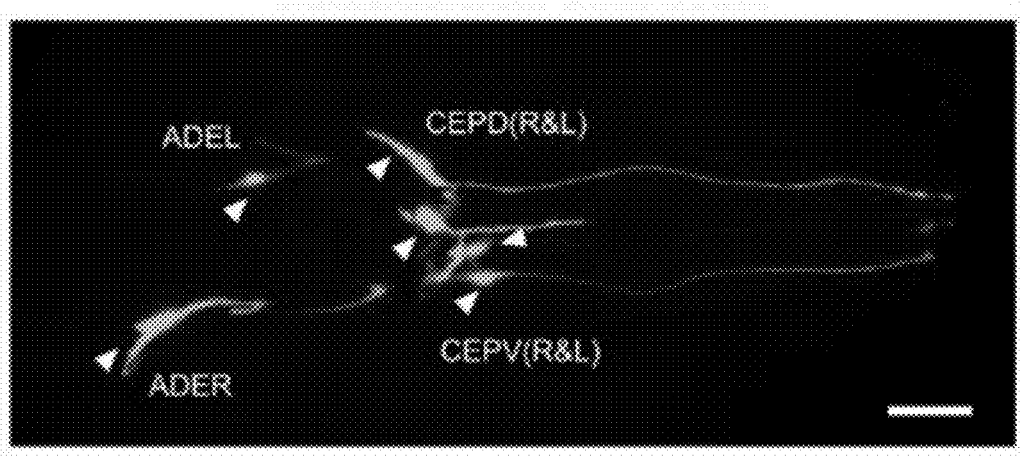
Figure 2D:
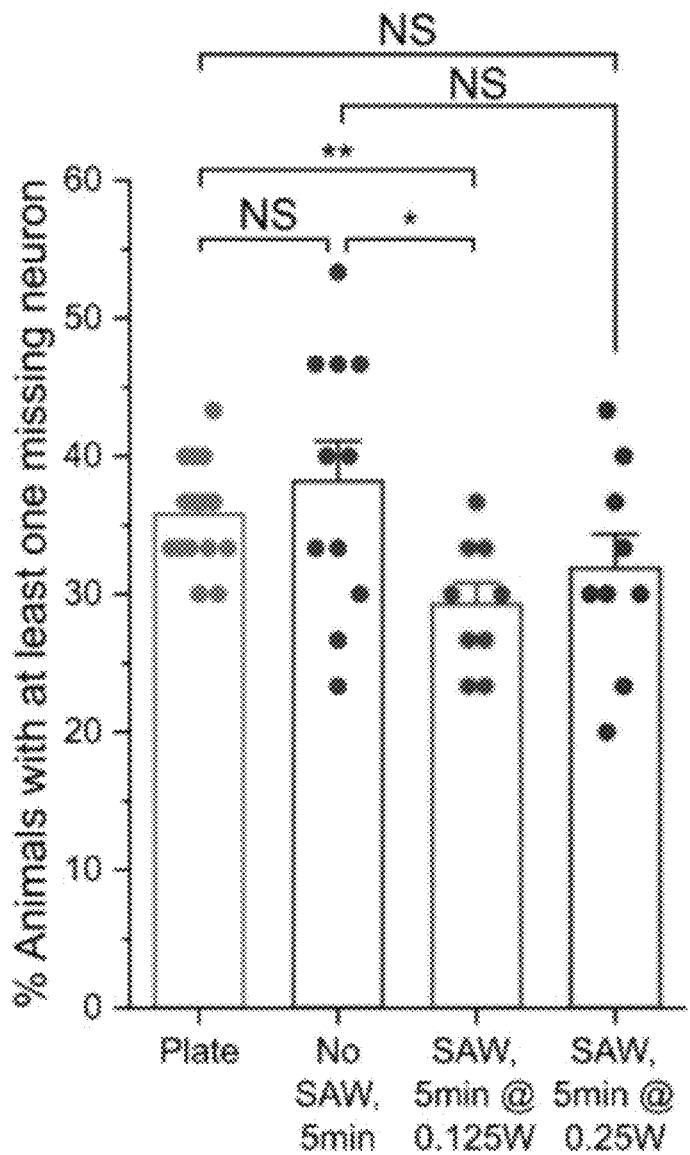
Figure 2E:
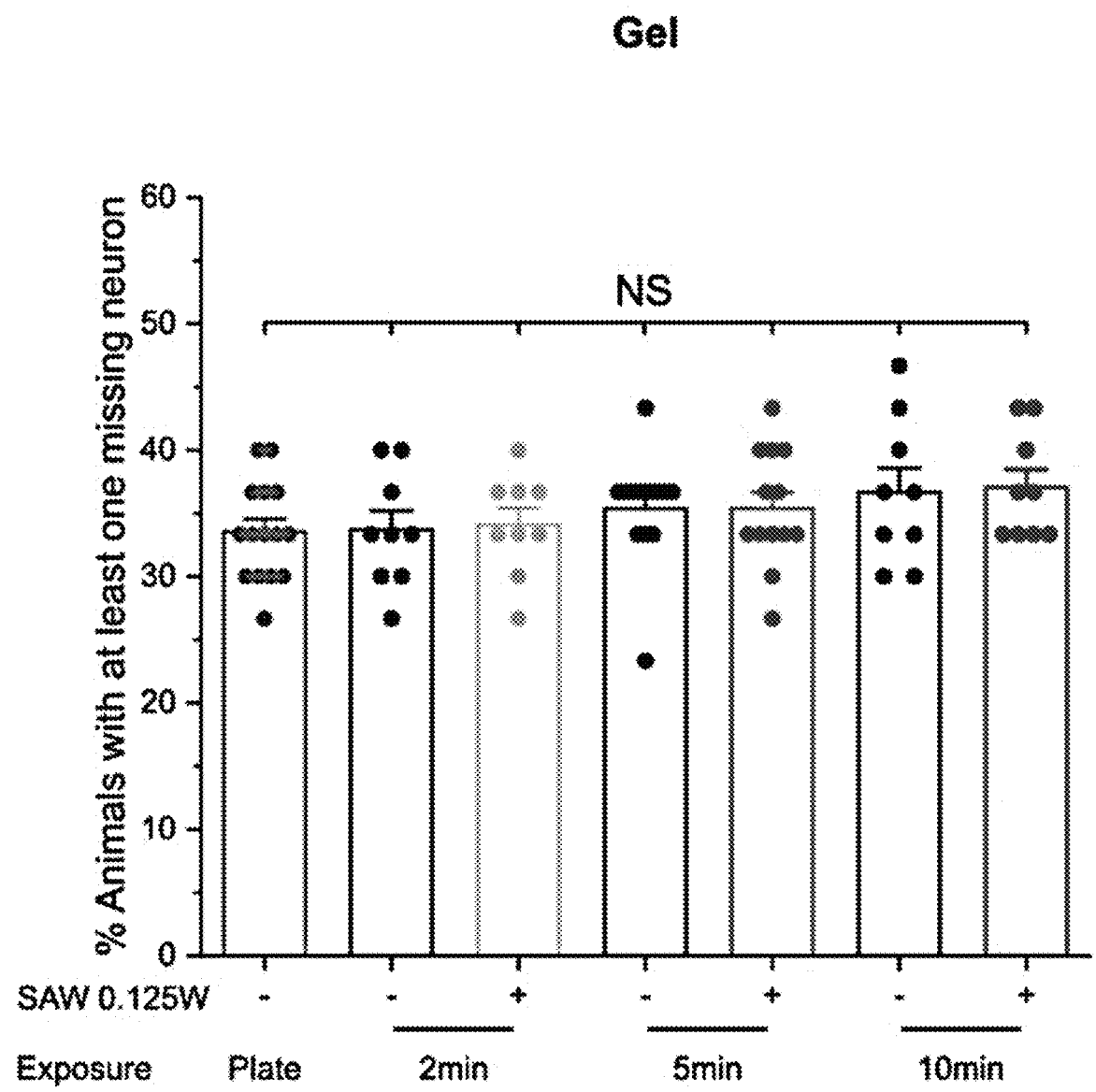
Figure 2F:
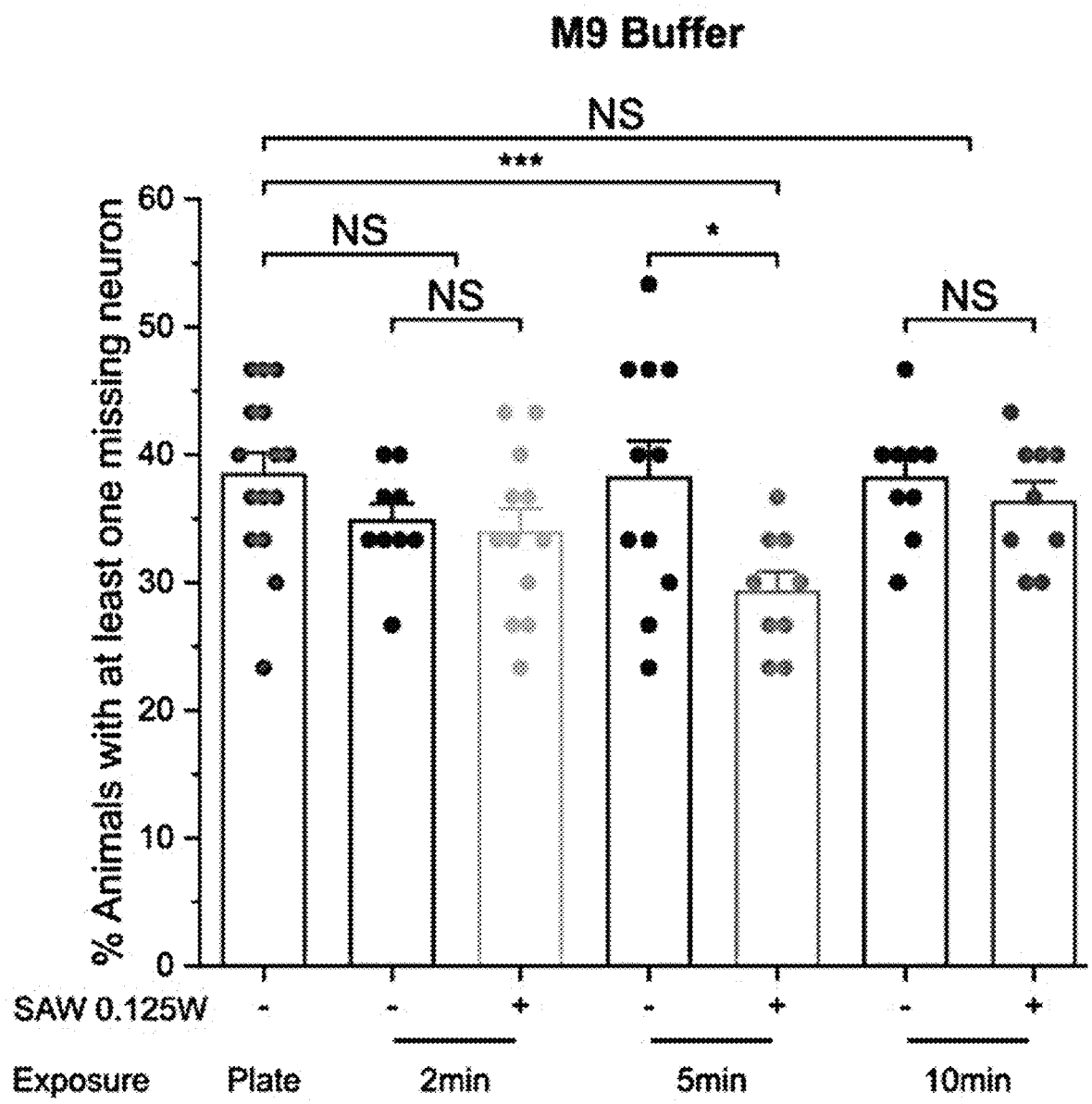
Figure 3:
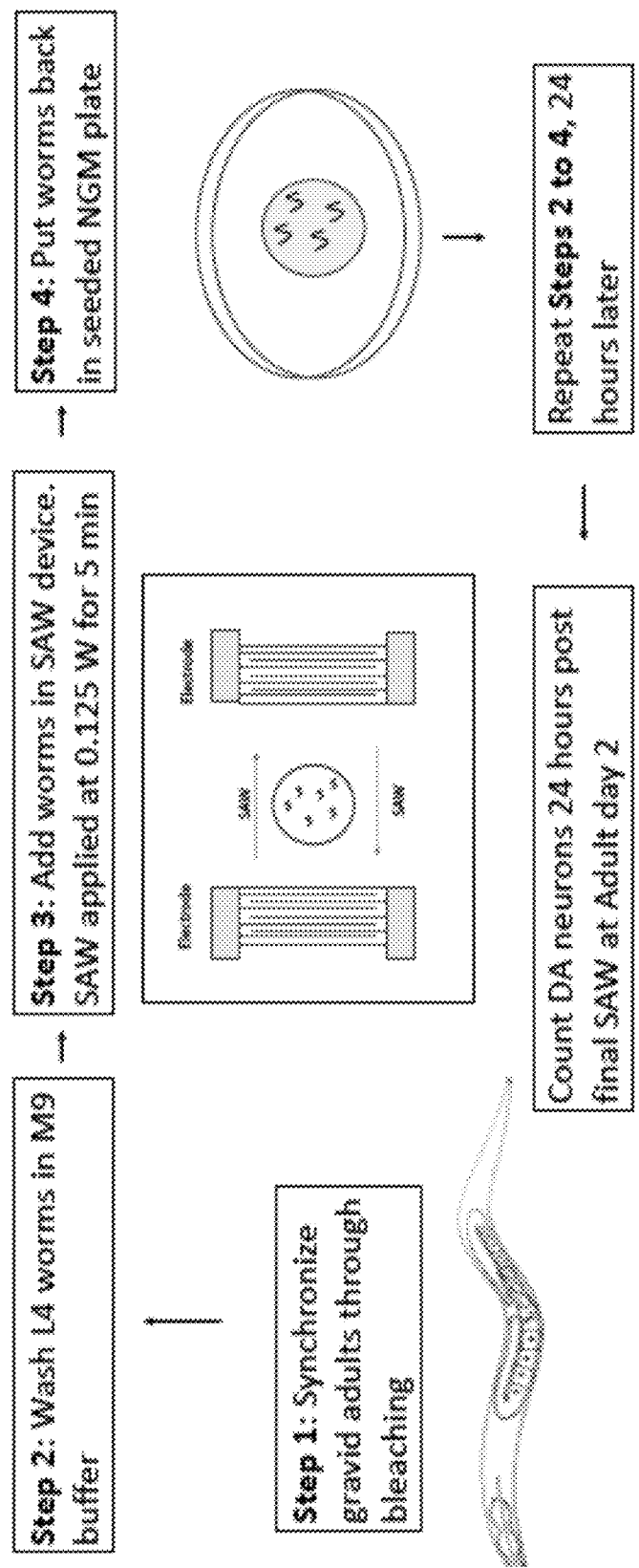
FIG. 3 is an illustration showing the materials and methods.
Figure 4A:
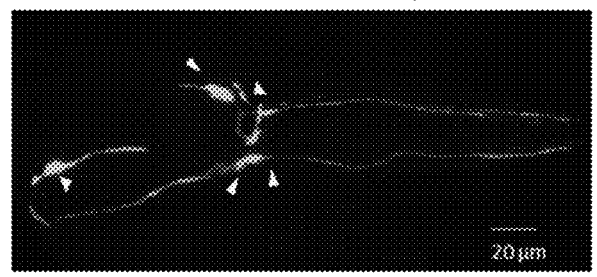
FIG. 4 is a set of two photographs and a graph showing results.
Figure 4B:
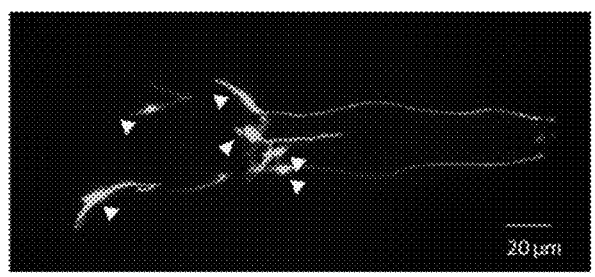
Figure 4C:
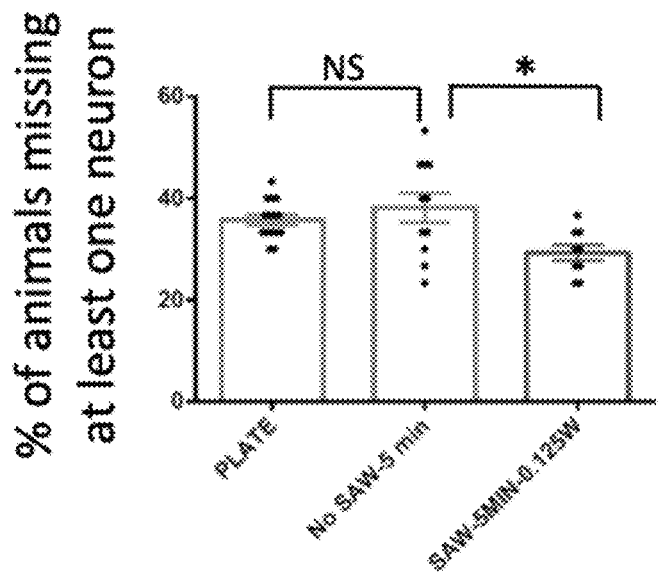

*C. elegans* has eight dopaminergic (DA) neurons, six in the head-four cephalic cells (CEPs) and two anterior deirids (ADEs), and two in the mid-section-posterior deirids (PDEs). For this study, the six head DA neurons in the head were focused on, which can be labeled by an integrated transgene vtIs1 containing the dat-1p::GFP reporter (FIG. 2A), a transcriptional green fluorescent protein (GFP) fusion of the dat-1 gene that encodes a dopamine transporter and is expressed only in eight DA neurons. For further experiments, we have used a *C. elegans* PD model can be used (FIGS. 2B and 2C), in which human α-synuclein (α-syn), an aggregation-prone protein associated with PD22, and GFP are co-expressed under the control of the dat-1 gene promoter in an integrated transgene, baIn11 (Pdat-1_:_:_α-syn/Pdat-1::GFP). baIn11 animals have been shown to cause significant DA neuronal loss23. For example, approximately 36% of day 2 baIn11 adult animals grown on nematode growth medium (NGM) plates have at least one missing DA neuron (FIG. 2D). Interestingly, when baIn11 animals were subjected to a 5-minute exercise each day induced by SAW at 0.125 W, 50% duty cycle power for two days, significant reduction of DA neuronal loss (29%) occurred (FIG. 2D). In comparison, no reduction in DA neuronal loss was observed when animals were allowed to swim freely in the SAW chamber without the application of SAW in the same 5-minute, 2-day schedule (FIG. 2D), indicating that exercise with a consistent intensity may be required to improve DA neuronal survival. When the liquid medium in the SAW chamber was replaced with 1% agarose gel, no rescue of DA neuron loss was seen with the same 2-day SAW treatment for 5 minutes each day, nor with a shorter (2 minutes) or longer (10 minutes) SAW treatment (FIG. 2E). In this gel-based experiment, SAW propagated through the gel without inducing streaming and animals were exposed to SAW without doing swimming exercise. Particle tracking comparisons showed that SAW was able to propagate through the gel and produce similar non-streaming acoustic effects on the animals when compared with the liquid medium. These results suggest that exercise, and not the direct impact of SAW, is responsible for improved neuronal protection. Under Acoustic Gym exercise, animals were observed to be swimming against the fluid stream direction. This positive rheotaxis has been reported previously in which *C. elegans* reorient its body toward the direction of fluid flow current. Unlike passive swimming exercise, SAW streaming provides a constant external stimulus that triggers the animals' movement.

The effect of the duration and intensity of exercise were tested next to investigate if they are important for neuronal rescue. Interestingly, SAW at 0.125 W and 50% duty cycle for 2 minutes and 10 minutes did not reduce DA neuronal loss compared with their corresponding no SAW control (FIG. 2E). Moreover, when the SAW power was increased to 0.25 W with the same 50% duty cycle for 5 minutes, which increased the streaming speed (FIG. 1D), reduction of neuronal loss was seen, but was not significant (FIG. 2D). These results together suggest that workout at the appropriate duration and intensity is crucial for achieving the goal of alleviating DA neuronal loss. High intensity and/or longer workout might induce oxidative stress that compromises the beneficial effect of exercise. Reports analyzing the relationship between exercise and oxidative stress suggest that low to moderate intensity workout promotes a reactive oxygen species (ROS)-mediated adaptive response in skeletal muscles that protects cells against oxidation, whereas high intensity workout results in a toxic effect.

Finally, the effect of SAW on the viability of animals was investigated by quantifying live animals in the chamber on day 1 and day 2 to determine the survival rate of animals with and without SAW treatment in both the liquid medium and the gel medium. No viability difference was seen between SAW and no SAW treatments, suggesting that the SAW treatment did not observably affect animal viability. However, in the experiments of SAW in liquid, there is a consistent loss of approximately 20% of animals between day 1 and day 2, due to adherence of animals to pipette tips, NGM plates, and the Acoustic Gym chamber. No increase in temperature following SAW at 0.125 W either in M9 or gel medium was observed.

This microfluidic device, Acoustic Gym, can induce a uniform swimming pattern and precisely controlled exercise intensity and duration on many *C. elegans* animals, leading to significant reduction of DA neuronal loss in the PD model that was tested. This device is easy to fabricate and can accommodate a large number of animals, which can be induced to swim synchronously with precisely controlled pattern, intensity and duration. This controllability is especially important since the data presented herein suggest that both the intensity and the duration of exercise need to be carefully adjusted to achieve optimal neuronal protection. Exercise for too long or at too high intensity failed to elicit beneficial effects. The observations in this *C. elegans* workout model can partially explain why different beneficial outcomes of exercise are observed in humans depending on the type of workouts performed. Unlike in humans, exercise stimulation reported previously in *C. elegans* is passive, time-consuming (hours), and very difficult to control and quantify. The devices taught herein readily overcome these major issues to facilitate a new and precise swim exercise regimen that occurs in minutes and will make *C. elegans* a powerful animal model for exercise-related studies. Numerous reports have suggested that moderate exercise induces neuroplasticity and neuronal repair, improves memories, and bestows other beneficial effects in humans and animal models and that DA neurons are more susceptible to the impact of exercise, leading to the mitigation of PD symptoms. The results presented herein underscore that efficient exercise with appropriate intensity and duration is crucial for achieving optimal beneficial effects. In particular, the ability and willingness to regularly exercise decrease as people get older due to physical frailty, especially in PD patients. This Acoustic Gym will facilitate identification of genes that mediate exercise-induced neuronal protection and other beneficial effects through genetic screens, RNA interference (RNAi) screens, and proteomic analysis. High-throughput drug screens can be performed using the systems taught herein to identify compounds that enhance the beneficial effects of light exercise or that can even replace exercise if physical conditions are not allowed.

Materials and Methods

Device Fabrication

The device consists of two major parts: the lithium niobate substrate patterned with the offset pair of IDTs, and the PDMS chamber. The LiNbO3 substrate was patterned using standard photolithography techniques. First, a layer of photoresist (S1813, Dow, USA) was spin coated onto a 3-inch, Y+36° X-propagation LiNbO3 wafer. The IDT structures were then patterned onto the wafer using UV light exposure and development in a photoresist developer (MF319, Dow, USA). Next, layers of chrome and gold (Cr/Au, 10/100 nm) were deposited using e-beam evaporation. Excess photoresist was removed with a lift-off process (Remover P G, Kayaku, Japan). Finally, the wafer was diced into multiple individual devices each with a pair of offset IDTs. Each individual IDT consists of 20 electrode pairs with a spacing of 50 μm and an aperture of 6 mm. The offset distance between each pair of IDTs is 3 mm and the horizontal distance is 18 mm.

The PDMS chamber was fabricated by pouring a mixture of PDMS base and cross linker (Sylgard 184, Dow Corning, USA) with a ratio of 10:1 w/w into a standard plastic petri dish. The height of the chamber was approximately 3 mm. The mixture was then placed under vacuum for 30 mins to remove air bubbles and then cured at 65° C. for one hour. An 8 mm biopsy hole puncher was used to punch out the outer diameter of chamber, while a 6 mm puncher was used for the inner diameter. The chamber was then bonded to the prepared LiNbO3 substrate after treatment with oxygen plasma (PDC-001, Harrick Plasma, USA). To ensure strong bonding, the device was baked overnight at 65° C.

Device Operation

An RF function generator (N5171B, Keysight, USA) and power amplifier (403LA, E & I, USA) were used to input the signal into the IDTs. To identify the resonant frequency of the devices, a network analyzer (E5061B, Keysight, USA) was used in combination with visually tracking the fastest velocity of streaming microparticles. Depending on the individual device, the resonant frequency was identified as approximately 18 MHz.

All SAW experiments were conducted on an inverted microscope (Eclipse Ti2, Nikon, Japan). The chamber was imaged with a digital CMOS camera (Orca-Flash 4.0 LT, Hamamatsu, Japan) in combination with the included imaging software (HCImage Live, Hamamatsu, Japan). Example videos with worms were recorded at 10 frames $s^{-1}$. Videos for particle characterization were recorded at 33 frames $s^{-1}$. Further processing of images and videos was done with ImageJ (NIH, USA).

Device Characterization

Polystyrene microparticles (15 μm, Polysciences, USA) were diluted (1:10 v/v) and dispersed into 60 μL of M9 buffer (22 mM $KH_2PO_4$, 42 mM $Na_2HPO_4$, 8.6 mM NaCl, and 18.7 mM $NH_4Cl$) to characterize the fluid streaming in the chamber. ImageJ TrackMate software was used to analyze the path of approximately 5000 particles to generate the velocity colormap. The instantaneous velocity of each individual particle track was then averaged together to calculate the overall mean velocity for each power level. To monitor the chamber temperature while applying SAW and during cool-down, a digital thermal probe was used.

Strains and Maintenance

*C. elegans* strains were maintained at 20° C. using standard methods. We used the N2 Bristol strain as the wild-type strain. The following alleles were used in this study: vtIs1 [dat-1p::GFP+rol-6(su1006)] V and baIn11(dat-1p::α-syn+ dat-1p::GFP)

Quantification of Dopaminergic (DA) Neuron Survival

The UA44 strain, in which GFP and α-syn are co-expressed in *C. elegans* dopaminergic (DA) neurons (baIn11), and the vtIs1 strain, where only the GFP is expressed in the DA neurons, were synchronized by bleaching with 20% Alkaline Hypochlorite solution (3 ml Bleach+ 3.75 ml 1 M NaOH+8.25 ml $H_2O$). The resulting L1 larvae were transferred to OP50 bacteria seeded NGM plates. The animals were scored for DA neuronal loss at adult day 2 with or without SAW treatment using 40× optic of Zeiss Axioplan 2 microscope equipped with epifluorescence.

Quantification of Viability of Animals after SAW Treatment

Images of the SAW chamber containing animals were taken before SAW treatment on both day 1 and day 2, in both fluid and gel. For each chamber image, worms were manually counted from 3 randomly selected regions of interest (0.5 mm×0.5 mm). The raw animal counts were normalized to the average day 1 values to calculate a percent loss of animals between day 1 and day 2.

Treatment with SAW in Fluid

Synchronized animals were allowed to grow until L4 larval stage in normal NGM plates. They were then washed off the NGM plates in M9 buffer, and approximately 500 animals were transferred to the SAW chamber in 60 μl of M9 buffer. SAW at different intensity and duration was applied. The animals were then transferred back to freshly seeded NGM plates. The same procedure was repeated the next day, at adult day 1. DA neuronal loss was scored on Adult day 2.

Treatment with SAW on Gel

50 μl of 1% agarose was added to the SAW chamber and allowed to solidify. Synchronized L4 stage animals were washed off the NGM plates and approximately about 100 animals were added in 10 μl of the M9 buffer to the gel bed and excess fluid was removed using Kimwipe. SAW at different intensity and duration was applied. Animals were then washed from the SAW chamber with the M9 buffer and transferred to fresh NGM plates. Using a tweezer, the gel in the SAW chamber was also transferred to the NGM plates to minimize animal loss. The same protocol was applied in the next day, on adult day 1. DA neuronal loss was scored on adult day 2.

Glossary of Claim Terms

A surface acoustic wave (SAW) is an acoustic wave traveling along the surface of a material exhibiting elasticity, with an amplitude that typically decays exponentially with depth into the material, such that they are confined to a depth of about one wavelength. Exemplary embodiments provide a surface acoustic wave ("SAW") device having a pair of interdigitated transducer ("IDT") electrodes and a microchamber capable of holding small worms during swimming motion. The IDT electrode may include aluminum, an aluminum alloy, or a combination thereof.

As used herein, the term "comprising" is intended to mean that the products, compositions and methods include the referenced components or steps, but not excluding others. "Consisting essentially of" when used to define products, compositions, and methods, shall mean excluding other components or steps of any essential significance. Thus, a composition consisting essentially of the recited components would not exclude trace contaminants and pharmaceutically acceptable carriers. "Consisting of" shall mean excluding more than trace elements of other components or steps.

As used in this application, the singular form "a," "an," and "the" include plural references unless the context clearly dictates otherwise. For example, the term "an agent" includes a plurality of agents, including mixtures thereof.

An individual is not limited to a human being but may also be other organisms including but not limited to mammals, plants, bacteria, or cells derived from any of the above.

Throughout this disclosure, various aspects of this invention can be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range. All references to the function log default to e as the base (natural log) unless stated otherwise (such as $\log_{10}$).

Aspects of the invention are disclosed with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer, or section from another element, component, region, layer or section. Thus, a first element, component, region, layer, or section discussed below could be termed a second element, component, region, layer, or section without departing from the teachings of the present invention.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs.

Exemplary embodiments are described herein with reference to illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims The advantages set forth above, and those made apparent from the foregoing description, are efficiently attained. Since certain changes may be made in the above construction without departing from the scope of the invention, it is intended that all matters contained in the foregoing description or shown in the accompanying drawings shall be interpreted as illustrative and not in a limiting sense.

All references cited in the present application are incorporated in their entirety herein by reference to the extent not inconsistent herewith.

It will be seen that the advantages set forth above, and those made apparent from the foregoing description, are efficiently attained and since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween. Now that the invention has been described,

What is claimed is:

1. A method of performing a swimming exercise on a worm under controlled conditions comprising the steps of:
   providing a surface acoustic wave (SAW) device comprising a circular chamber filled with fluid dimensioned to hold a small animal or plurality of animals, wherein the chamber is between a pair of offset interdigital transducers (IDTs) that are deposited on a piezoelectric substrate and wherein upon actuation from a radio frequency (RF) source a SAW is generated and propagates along the piezoelectric substrate towards the chamber whereby it induces an acoustic streaming in the fluid inside the chamber to stimulate swimming exercise of the small animal or small animals;

placing one or more worms in the fluid filled chamber of the SAW device; and applying power levels of 0.125 W or lower and a 50% duty cycle or lower.

2. The method of performing a swimming exercise on a worm under controlled conditions according to claim 1 wherein the worm is *C. elegans*.

3. The method of performing a swimming exercise on a worm under controlled conditions according to claim 1 further comprising the step of contacting the worm with one or more compounds to be screened for alleviating dopaminergic (DA) neuronal loss.

4. The method of performing a swimming exercise on a worm under controlled conditions according to claim 1 wherein the SAW device further comprises a radio frequency (RF) source in communication with the IDTs.

5. The method of performing a swimming exercise on a worm under controlled conditions according to claim 4 wherein the SAW device produces a streaming velocity that can be controlled via the RF signal input power.

6. The method of performing a swimming exercise on a worm under controlled conditions according to claim 1 wherein the SAW device further comprises a controller and wherein the SAW device produces a streaming velocity that can be controlled via the RF signal input power, thus regulating the duration and intensity of exercise of the worm.

7. The method of performing a swimming exercise on a worm under controlled conditions according to claim 1 wherein each individual IDT consists of about 20 electrode pairs with a spacing of about 50 μm and an aperture of about 6 mm.

8. The method of performing a swimming exercise on a worm under controlled conditions according to claim 1 wherein the offset distance between each pair of IDTs is about 3 mm and the horizontal distance is about 18 mm.

* * * * *